(12) United States Patent
Joshi et al.

(10) Patent No.: US 9,738,056 B2
(45) Date of Patent: Aug. 22, 2017

(54) SYSTEMS OF BONDED SUBSTRATES AND METHODS FOR BONDING SUBSTRATES

(71) Applicant: Toyota Motor Engineering & Manufacturing North America, Inc., Erlanger, KY (US)

(72) Inventors: Shailesh Joshi, Ann Arbor, MI (US); Masao Noguchi, Ann Arbor, MI (US); Ercan Mehmet Dede, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 56 days.

(21) Appl. No.: 14/862,564

(22) Filed: Sep. 23, 2015

(65) Prior Publication Data

US 2017/0080682 A1 Mar. 23, 2017

(51) Int. Cl.
| | |
|---|---|
| B32B 7/04 | (2006.01) |
| H01L 23/367 | (2006.01) |
| H01L 23/373 | (2006.01) |
| B32B 9/04 | (2006.01) |
| B32B 15/00 | (2006.01) |
| B32B 37/14 | (2006.01) |

(52) U.S. Cl.
CPC .......... *B32B 7/04* (2013.01); *B32B 9/04* (2013.01); *B32B 15/00* (2013.01); *B32B 37/14* (2013.01); *H01L 23/3675* (2013.01); *H01L 23/3735* (2013.01); *B32B 2457/14* (2013.01)

(58) Field of Classification Search
None
See application file for complete search history.

(56) References Cited

U.S. PATENT DOCUMENTS

| | | |
|---|---|---|
| 3,839,727 A | 10/1974 | Herdzik et al. |
| 5,121,871 A | 6/1992 | Beavis et al. |
| 6,897,123 B2 | 5/2005 | Winther |
| 7,690,551 B2 | 4/2010 | You Yang |
| 8,338,287 B2 | 12/2012 | Miura et al. |
| 2009/0087644 A1 | 4/2009 | Supriya et al. |

*Primary Examiner* — Christopher Polley
(74) *Attorney, Agent, or Firm* — Dinsmore & Shohl LLP (57) ABSTRACT

In one embodiment, a system of bonded substrates may include a first substrate, a second substrate, and a composite bonding layer positioned between the first substrate and the second substrate. The composite boding layer may include an interior bond region, an exterior bond region, and a metal matrix. The material of the interior bond region may have a greater elastic modulus than the material of the exterior bond region. A portion of the metal matrix may be in the interior bond region and a portion of the metal matrix may be in the exterior bond region. The composite bonding layer may also include a plurality of soft material members positioned in the portion of the metal matrix in the exterior bond region, or a plurality of hard material members positioned in the portion of the metal matrix in the interior bond region, or both.

20 Claims, 5 Drawing Sheets

SYSTEMS OF BONDED SUBSTRATES AND METHODS FOR BONDING SUBSTRATES

TECHNICAL FIELD

The present specification generally relates to the bonding of substrates and, more specifically, to the bonding of substrates exposed to thermal cycling.

BACKGROUND

Components of electrical devices which operate at elevated temperatures may need to be bonded with one another. For example, power semiconductor devices, such as those fabricated from silicon carbide, may be designed to operate at very high operating temperatures (e.g., greater than 250° C.). Such power semiconductor devices may be bonded to a cooling device, such as heat sink or a liquid cooling assembly. The cooling device removes heat from the power semiconductor to ensure that it operates at a temperature that is below its maximum operating temperature. The bonding layer that bonds the power semiconductor device to the cooling device must be able to withstand the high operating temperatures of the power semiconductor device. However, conventional bonding techniques may not have sufficient bond strength over thermal cycling. For example, conventional bonding techniques may not be suitable for bonded systems exposed to the thermal cycling of a power semiconductor device.

Accordingly, a need exists for alternative methods and bonding layers for bonding two substrates with another.

SUMMARY

In one embodiment, a system of bonded substrates may comprise a first substrate comprising a bonding surface, a second substrate comprising a complementary bonding surface, and a composite bonding layer positioned between the first substrate and the second substrate and in contact with the bonding surface of the first substrate and the complementary bonding surface of the second substrate. The composite boding layer may comprise an interior bond region, an exterior bond region, and a metal matrix. The exterior bond region may be positioned around the interior bond region and may define an outer surface of the composite bonding layer. The material of the interior bond region may have a greater elastic modulus than the material of the exterior bond region. A portion of the metal matrix may be in the interior bond region and a portion of the metal matrix may be in the exterior bond region. The composite bonding layer may also comprise a plurality of soft material members positioned in the portion of the metal matrix in the exterior bond region, or a plurality of hard material members positioned in the portion of the metal matrix in the interior bond region, or both. The soft material members have an elastic modulus less than the elastic modulus of the metal matrix and the hard material members have an elastic modulus greater than the elastic modulus of the metal matrix.

In another embodiment, the soft material members may comprise pure metals, polymers, or combinations thereof. The hard material members may comprise ceramics, intermetallic alloys, or combinations thereof.

In yet another embodiment, a first substrate may be bonded to a second substrate by a method that may comprise providing the first substrate comprising a bonding surface, providing the second substrate comprising a complementary bonding surface, providing a composite bonding layer precursor positioned between the first substrate and the second substrate, and forming a composite bonding layer. The bonding layer precursor may be in contact with the bonding surface of the first substrate and the complementary bonding surface of the second substrate. The composite boding layer may comprise an interior bond region, an exterior bond region, and a metal matrix. The exterior bond region may be positioned around the interior bond region and may define an outer surface of the composite bonding layer. The material of the interior bond region may have a greater elastic modulus than the material of the exterior bond region. A portion of the metal matrix may be in the interior bond region and a portion of the metal matrix may be in the exterior bond region. The composite bonding layer may also comprise a plurality of soft material members positioned in the portion of the metal matrix in the exterior bond region, or a plurality of hard material members positioned in the portion of the metal matrix in the interior bond region, or both. The soft material members have an elastic modulus less than the elastic modulus of the metal matrix and the hard material members have an elastic modulus greater than the elastic modulus of the metal matrix.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Referring generally to the figures, embodiments of the present disclosure are directed to methods for bonding two or more substrates together with a thermally conductive bonding layer, and additionally, to the resulting bonded substrate systems. In some embodiments, the thermally conductive bonding layers disclosed herein may be thermally stable through exposure to thermal cycling, such as that experienced by bonds utilized in power semiconductor devices. Generally, each of the substrates may comprise a substrate bonding surface which contacts a bonding layer that is positioned between and contacting the substrates. Reduced cracking and reduced creep may be characteristic of the bonding layers described herein.

It has been observed that mechanical failures in bonding systems which are exposed to thermal cycling may be caused by a mismatch of the coefficient of thermal expansion of the bonding layer and the attached substrates. These failures, sometimes caused by induced thermal stresses, may be observed by at least two different failure modes: crack propagation in the bonding layer and creep deformation in the bonding layer. Cracks may propagate by the repeated stresses caused by thermal cycling. Creep deformation may be caused by the constant stresses exerted on the bonding layer by the attached substrates or by residual stresses in the bonding layer formed during bond formation.

It has been discovered that crack propagation in a bonding layer may be reduced or completely avoided by the utilization of a bonding layer that is relatively soft. On the other hand, creep deformation can be reduced or completely avoided by the utilization of a bonding layer that is relatively hard. However, a soft bonding layer may be more affected by creep deformation and a hard bonding layer may be more affected by crack propagation. As used herein "soft" refers to a material having relatively low elastic modulus, and "hard" refers to a material having a relatively high elastic modulus. For example, bonding layers comprising intermetallic alloys may be hard and brittle, and may crack, especially at the outer surface of the bonding layer. On the other hand, pure metal bonding layers may be susceptible to creep deformation due to their relative softness and ductility.

According to embodiments described herein, a bonding layer may include one or more of soft material members or hard material members incorporated into the bonding layer, forming a composite bonding layer. Embodiments described herein may contain the soft material members in an exterior region of the composite bonding layer (referred to sometimes herein as the "exterior bond region"), may comprise the hard material members in the interior region of the bonding layer (referred to sometimes herein as the "interior bond region"), or both. Without being bound by theory, it is believed that the incorporation of soft material members or hard material members creates a composite bonding layer which has higher elastic modulus in the interior region of the bonding layer and lower elastic modulus in the exterior region of the bonding layer. In such an embodiment, the relatively soft exterior region of the bonding layer may reduce crack propagation and the relatively hard interior region of the bonding layer may reduce creep deformation. In other embodiments, the hard material members or soft material members may be integrated into a composite bonding layer in different proportions in the interior bond region and the exterior bond region to form relatively soft and hard regions of the exterior and interior portions of the bonding layer, respectively.

Figure 1:
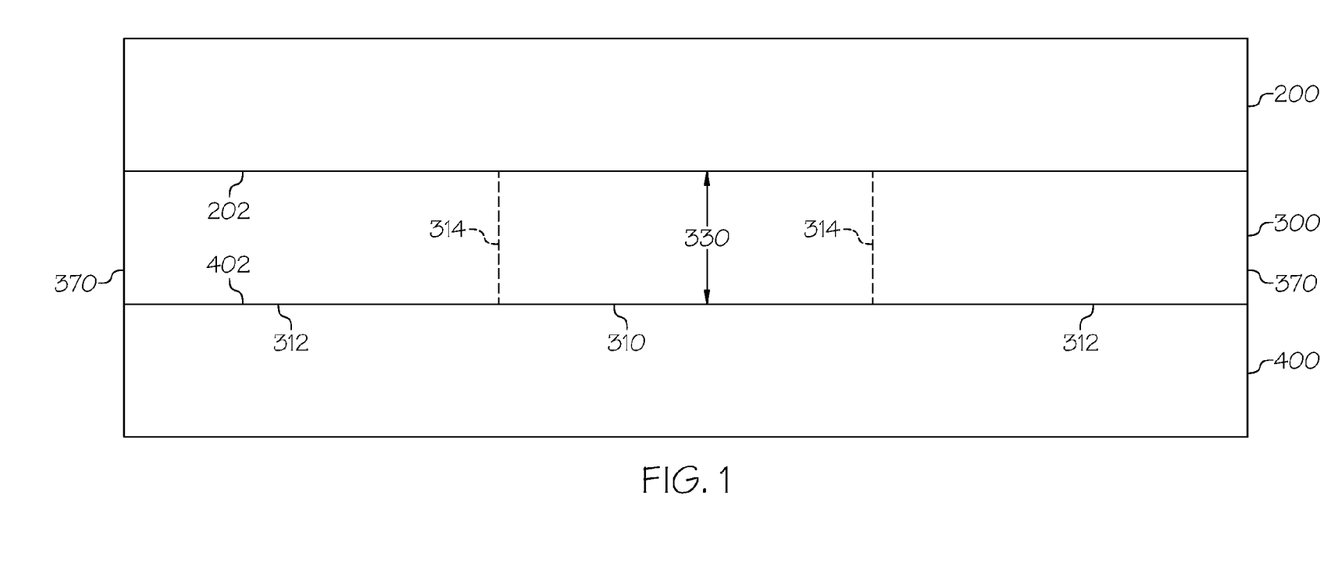
FIG. 1 schematically depicts a cross-sectional side view of two substrates bonded to one another with a composite bonding layer, according to one or more embodiments shown and described herein.

FIG. 1 generally depicts a system of bonded substrates 100 comprising an upper substrate 200 and a lower substrate 400 bonded to one another with a composite bonding layer 300. The composite bonding layer 300 is positioned generally between the upper substrate 200 and the lower substrate 400 and directly contacting the upper substrate 200 at the upper substrate bonding surface 202 and the lower substrate 400 at the complementary lower substrate bonding surface 402. The composite bonding layer 300 may comprise alloys of metals, pure metals, or each in different portions of the composite bonding layer 300. As used herein, an "alloy" refers to a material composition that comprises at least two metallic or metalloid components, and a "pure metal" refers to a material that comprises at least about 99.5 wt. % of an elemental metal. As used herein "metals" refer to materials comprising metal elements, metalloid elements, or combinations thereof, in an amount of at least about 50.

In one embodiment, the lower substrate bonding surface 402 and/or the upper substrate bonding surface 202 may be substantially planar and substantially parallel relative to one another. While one substrate is referred to herein as the "upper substrate" and the other substrate is referred to herein as the "lower substrate," the two substrates 200, 400 need not necessarily be arranged above and below one another, and the nomenclature of "upper" and "lower" is merely representative of the relative positioning in the upper substrate 200 and lower substrate 400 as depicted in the drawings described herein. Additionally, it should be understood herein that any feature of the upper substrate 200 may be included in the lower substrate 400, and vice versa. Generally, the lower substrate 400 and the upper substrate 200 each comprise bonding surfaces, referred to as the lower substrate bonding surface 402 and upper substrate bonding surface 202, respectively. The lower substrate bonding surface 402 and upper substrate bonding surface 202 may be referred to as "complementary" herein, meaning that the two bonding surfaces generally have geometries making them suitable for bonding with one another, such as with a composite bonding layer 300 as described in embodiments herein.

It is contemplated herein that the composition of the lower substrate 400 at the lower substrate bonding surface 402 may be any of the material compositions disclosed herein as a composition of the lower substrate 400. Additionally, it is contemplated herein that the composition of the upper substrate 200 at the upper substrate bonding surface 202 may be any of the material compositions disclosed herein as a composition of the upper substrate 200. In some embodiments, the material composition of the lower substrate 400 and the upper substrate 200 may vary between the portions of each. For example, the material composition at the lower substrate bonding surface 402 may be different from the composition of other portions of the lower substrate 400, and the material composition at the upper substrate bonding surface 202 may be different from the composition of other portions of the upper substrate 200. For example, the upper substrate 200 or the lower substrate 400 may comprise a coating layer at the upper substrate bonding surface 202 or lower substrate bonding surface 402, respectively.

The lower substrate 400 may comprise a wide variety of materials, including, but not limited to, one or more metals or alloys such as, but not limited to, materials comprising copper, aluminum, nickel, or combinations thereof. In embodiments, the lower substrate 400 may comprise at least about 50 wt. % copper, at least about 60 wt. % copper, at least about 70 wt. % copper, at least about 80 wt. % copper, at least about 90 wt. % copper, at least about 95 wt. % copper, at least about 99 wt. % copper, at least about 99.5 wt. % copper, at least about 50 wt. % aluminum, at least about 60 wt. % aluminum, at least about 70 wt. % aluminum, at least about 80 wt. % aluminum, at least about 90 wt. % aluminum, at least about 95 wt. % aluminum, at least about 99 wt. % aluminum, at least about 99.5 wt. % aluminum, at least about 50 wt. % nickel, at least about 60 wt. % nickel, at least about 70 wt. % nickel, at least about 80 wt. % nickel, at least about 90 wt. % nickel, at least about 95 wt. % nickel, at least about 99 wt. % nickel, and/or at least about 99.5 wt. % nickel. For example, the lower substrate 400 may comprise a heat sink for a power electronic device.

In other embodiments, the lower substrate 400 may comprise metal oxides, metal nitrides, metal carbides, or combinations thereof, including, but not limited to, alumina, beryllium oxide, aluminum nitride, silicon carbide, or combinations thereof. For example, the lower substrate 400 may be a die for a power electronic device. In embodiments, the lower substrate 400 may comprise at least about 50 wt. % metal oxides, at least about 60 wt. % metal oxides, at least about 70 wt. % metal oxides, at least about 80 wt. % metal oxides, at least about 90 wt. % metal oxides, at least about 95 wt. % metal oxides, at least about 99 wt. % metal oxides, at least about 99.5 wt. % metal oxides, at least about 50 wt. % metal nitrides, at least about 60 wt. % metal nitrides, at least about 70 wt. % metal nitrides, at least about 80 wt. % metal nitrides, at least about 90 wt. % metal nitrides, at least about 95 wt. % metal nitrides, at least about 99 wt. % metal nitrides, at least about 99.5 wt. % metal nitrides, at least about 50 wt. % metal carbides, at least about 60 wt. % metal carbides, at least about 70 wt. % metal carbides, at least about 80 wt. % metal carbides, at least about 90 wt. % metal carbides, at least about 95 wt. % metal carbides, at least about 99 wt. % metal carbides, and/or at least about 99.5 wt. % metal carbides.

In one embodiment, the lower substrate 400 may comprise a direct bonded metal, such as, but not limited to, direct bonded copper (DBC) or direct bonded aluminum (DBA) at the lower substrate bonding surface 402. For example, direct bonded metallic layer may be bonded to a bulk material by a high-temperature oxidation process where copper and the bulk material are heated to a controlled temperature in an atmosphere of nitrogen containing about 30 ppm of oxygen to form a copper-oxygen eutectic. In another embodiment, the lower substrate 400 may comprise a material that is metal plated on the lower substrate bonding surface 402, such as a nickel plated lower substrate bonding surface 402.

The upper substrate 200 may comprise a wide variety of materials, including, but not limited to, one or more metals or alloys such as, but not limited to, materials comprising copper, aluminum, nickel, or combinations thereof. In embodiments, the upper substrate 200 may comprise at least about 50 wt. % copper, at least about 60 wt. % copper, at least about 70 wt. % copper, at least about 80 wt. % copper, at least about 90 wt. % copper, at least about 95 wt. % copper, at least about 99 wt. % copper, at least about 99.5 wt. % copper, at least about 50 wt. % aluminum, at least about 60 wt. % aluminum, at least about 70 wt. % aluminum, at least about 80 wt. % aluminum, at least about 90 wt. % aluminum, at least about 95 wt. % aluminum, at least about 99 wt. % aluminum, at least about 99.5 wt. % aluminum, at least about 50 wt. % nickel, at least about 60 wt. % nickel, at least about 70 wt. % nickel, at least about 80 wt. % nickel, at least about 90 wt. % nickel, at least about 95 wt. % nickel, at least about 99 wt. % nickel, and/or at least about 99.5 wt. % nickel. For example, the upper substrate 200 may comprise a heat sink for a power electronic device. It is contemplated herein that the composition of the upper substrate 200 at the upper substrate bonding surface 202 may be any of the material compositions disclosed herein.

In other embodiments, the upper substrate 200 may comprise metal oxides, metal nitrides, metal carbides, or combinations thereof, including, but not limited to, alumina, beryllium oxide, aluminum nitride, silicon carbide, or combinations thereof. For example, the upper substrate 200 may comprise a die for a power electronic device. In embodiments, the upper substrate 200 may comprise at least about 50 wt. % metal oxides, at least about 60 wt. % metal oxides, at least about 70 wt. % metal oxides, at least about 80 wt. % metal oxides, at least about 90 wt. % metal oxides, at least about 95 wt. % metal oxides, at least about 99 wt. % metal oxides, at least about 99.5 wt. % metal oxides, at least about 50 wt. % metal nitrides, at least about 60 wt. % metal nitrides, at least about 70 wt. % metal nitrides, at least about 80 wt. % metal nitrides, at least about 90 wt. % metal nitrides, at least about 95 wt. % metal nitrides, at least about 99 wt. % metal nitrides, at least about 99.5 wt. % metal nitrides, at least about 50 wt. % metal carbides, at least about 60 wt. % metal carbides, at least about 70 wt. % metal carbides, at least about 80 wt. % metal carbides, at least about 90 wt. % metal carbides, at least about 95 wt. % metal carbides, at least about 99 wt. % metal carbides, and/or at least about 99.5 wt. % metal carbides. It is contemplated herein that the composition of the upper substrate 200 at the upper substrate bonding surface 202 may be any of the material compositions disclosed herein.

In one embodiment, the upper substrate 200 may comprise a direct bonded metal, such as, but not limited to, direct bonded copper (DBC) or direct bonded aluminum (DBA) at the upper substrate bonding surface 202. For example, direct bonded metallic layer may be bonded to a bulk material by a high-temperature oxidation process where copper and the bulk material are heated to a controlled temperature in an atmosphere of nitrogen containing about 30 ppm of oxygen to form a copper-oxygen eutectic. In another embodiment, the upper substrate 200 may comprise a material that is metal plated on the upper substrate bonding surface 202, such as a nickel plated upper substrate bonding surface 202.

The composite bonding layer 300 may comprise an interior bond region 310 and an exterior bond region 312. The exterior bond region 312 is positioned around the interior bond region 310 and may define an outer surface 370 of the composite bonding layer 300. The interior bond region 310 may be separated from the exterior bond region 312 by region interface 314. The interior bond region 310 is positioned between and contacting the upper substrate 200 and lower substrate 400, generally positioned at the center of the composite bonding layer 300. The exterior bond region 312 also contacts the upper substrate 200 and lower substrate 400, and defines the outer surface 370 of the composite bonding layer 300. Generally, the composition of the interior bond region 310 is different from that of the exterior bond region 312. While FIG. 1 depicts a region interface 314 that is a defined line, the region interface 314 may be a gradual transition of material compositions.

Generally, the material of the interior bond region 310 may have a greater elastic modulus than the material of the exterior bond region 312. The "elastic modulus" of a material, sometimes referred to as the Young's modulus, is a measure of the stiffness of an elastic material and is a quantity used to characterize materials. It is defined as the ratio of the stress (force per unit area) along an axis to the strain (ratio of deformation over initial length) along that axis in the range of stress in which Hooke's law holds. As used herein, the elastic modulus of the material of the exterior bond region 312 or the elastic modulus of the material of the interior bond region 310 refers to the elastic modulus of the bulk material of the exterior bond region 312 or interior bond region 310, respectively.

In embodiments, the material of the exterior bond region 312 may have an elastic modulus of less than or equal to about 200 GPa, less than or equal to about 150 GPa, less than or equal to about 100 GPa, less than or equal to about 90 GPa, less than or equal to about 80 GPa, less than or equal to about 70 GPa, less than or equal to about 60 GPa, less than or equal to about 50 GPa, less than or equal to about 40 GPa, less than or equal to about 30 GPa, less than or equal to about 20 GPa, less than or equal to about 10 GPa, less than or equal to about 5 GPa, or even less than or equal to about 1 GPa.

In embodiments, the material of the interior bond region 310 may have an elastic modulus of greater than or equal to about 1 GPa, greater than or equal to about 2 GPa, greater than or equal to about 5 GPa, greater than or equal to about 10 GPa, greater than or equal to about 20 GPa, greater than or equal to about 30 GPa, greater than or equal to about 40 GPa, greater than or equal to about 50 GPa, greater than or equal to about 60 GPa, greater than or equal to about 70 GPa, greater than or equal to about 80 GPa, greater than or equal to about 90 GPa, greater than or equal to about 100 GPa, greater than or equal to about 150 GPa, or even greater than or equal to about 200 GPa.

For example, in embodiments, the material of the interior bond region 310 may have an elastic modulus at least about 1% greater, at least about 2% greater, at least about 3% greater, at least about 4% greater, at least about 5% greater, at least about 10% greater, at least about 25% greater, at least about 50% greater, or even at least about 100% greater than the material of the exterior bond region 312.

Figure 2A:
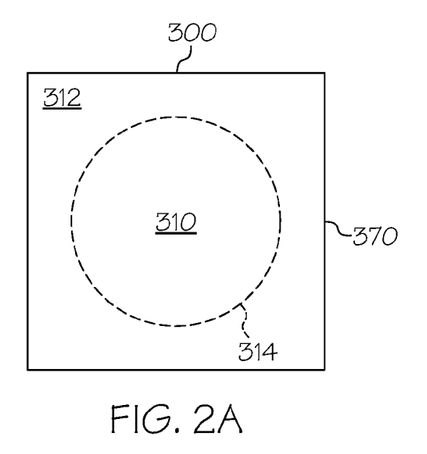
FIG. 2A schematically depicts a cross-sectional top view of the interior and exterior portions of a composite bonding layer, according to one or more embodiments shown and described herein.
Figure 2B:
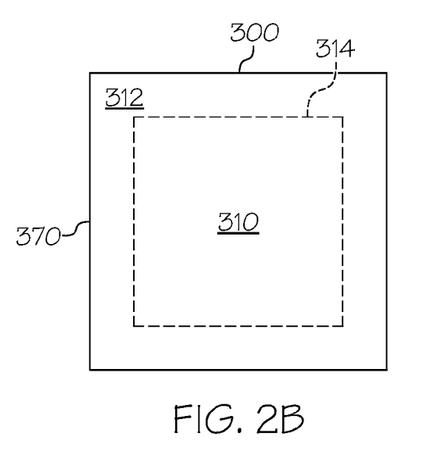
FIG. 2B schematically depicts a cross-sectional top view of the interior and exterior portions of a composite bonding layer, according to one or more embodiments shown and described herein.
Figure 2C:
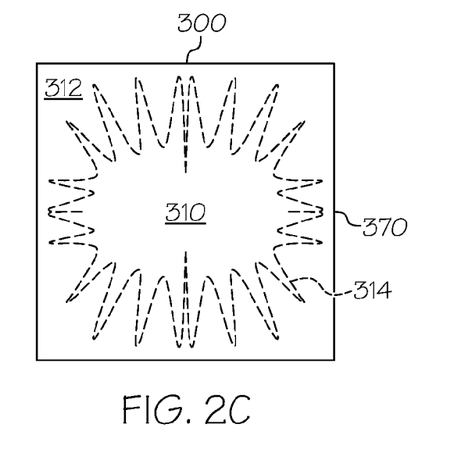
FIG. 2C schematically depicts a cross-sectional top view of the interior and exterior portions of a composite bonding layer, according to one or more embodiments shown and described herein.

Referring now to FIGS. 2A, 2B, and 2C, a top view of the interior bond region 310 and exterior bond region 312 may be defined by various geometric shapes. For example, FIG. 2A depicts a circular shaped interior bond region 310, FIG. 2B depicts a rectangular shaped interior bond region 310, and FIG. 2C depicts a finger-like shaped interior bond region 310. While FIGS. 2A, 2B, and 2C show various embodiments, other geometric shapes of the interior bond region 310 are contemplated herein, such as, but not limited to, a globular or polygonal shaped interior bond region 310. The finger-like interior bond region 310 may provide good crack propagation characteristics while also allowing for enhanced creep resistance. In embodiments, the interior bond region 310 may comprise greater than or equal to about 10% by volume, greater than or equal to about 20% by volume, greater than or equal to about 30% by volume, greater than or equal to about 40% by volume, greater than or equal to about 50% by volume, greater than or equal to about 60% by volume, greater than or equal to about 70% by volume, greater than or equal to about 80% by volume, or even greater than or equal to about 90% by volume of the composite bonding layer 300.

Referring now to FIGS. 3-7, the composite bonding layer 300 comprises a metal matrix 308 and one or more of soft material members 304, and hard material members 306. In general, the soft material members 304 may contribute to a reduced elastic modulus in the exterior bond region 312 and/or the hard material members 306 may contribute to an increased elastic modulus in the exterior bond region 312. Generally, the hard material members 306 and soft material members 304 are embedded in the metal matrix 308, where the hard material members 306 and soft material members 304 may be partially or fully surrounded by metal matrix 306. In embodiments, the metal matrix 308 may be substantially homogenous or may be heterogeneous in composition. The composition of the metal matrix 308 in the exterior bond region 312 may be similar or identical to the composition of the metal matrix 308 in the exterior bond region 312.

The metal matrix 308 may comprise a wide variety of materials, including, but not limited to, one or more metals or alloys such as, but not limited to, materials comprising copper, aluminum, nickel, tin or combinations thereof. In embodiments, the lower substrate 400 may comprise at least about 50 wt. % copper, at least about 60 wt. % copper, at least about 70 wt. % copper, at least about 80 wt. % copper, at least about 90 wt. % copper, at least about 95 wt. % copper, at least about 99 wt. % copper, at least about 99.5 wt. % copper, at least about 50 wt. % aluminum, at least about 60 wt. % aluminum, at least about 70 wt. % aluminum, at least about 80 wt. % aluminum, at least about 90 wt. % aluminum, at least about 95 wt. % aluminum, at least about 99 wt. % aluminum, at least about 99.5 wt. % aluminum, at least about 50 wt. % nickel, at least about 60 wt. % nickel, at least about 70 wt. % nickel, at least about 80 wt. % nickel, at least about 90 wt. % nickel, at least about 95 wt. % nickel, at least about 99 wt. % nickel, and/or at least about 99.5 wt. % nickel. For example, the lower substrate 400 may comprise a heat sink for a power electronic device.

In other embodiments, the metal matrix 308 may comprise metal oxides, metal nitrides, metal carbides, or combinations thereof, including, but not limited to, alumina, beryllium oxide, aluminum nitride, silicon carbide, or combinations thereof. For example, the lower substrate 400 may be a die for a power electronic device. In embodiments, the lower substrate 400 may comprise at least about 50 wt. % metal oxides, at least about 60 wt. % metal oxides, at least about 70 wt. % metal oxides, at least about 80 wt. % metal oxides, at least about 90 wt. % metal oxides, at least about 95 wt. % metal oxides, at least about 99 wt. % metal oxides, at least about 99.5 wt. % metal oxides, at least about 50 wt. % metal nitrides, at least about 60 wt. % metal nitrides, at least about 70 wt. % metal nitrides, at least about 80 wt. % metal nitrides, at least about 90 wt. % metal nitrides, at least about 95 wt. % metal nitrides, at least about 99 wt. % metal nitrides, at least about 99.5 wt. % metal nitrides, at least about 50 wt. % metal carbides, at least about 60 wt. % metal carbides, at least about 70 wt. % metal carbides, at least about 80 wt. % metal carbides, at least about 90 wt. % metal carbides, at least about 95 wt. % metal carbides, at least about 99 wt. % metal carbides, and/or at least about 99.5 wt. % metal carbides.

In embodiments, the metal matrix 308 may comprise greater than or equal to about 10% by volume, greater than or equal to about 20% by volume, greater than or equal to about 30% by volume, greater than or equal to about 40% by volume, greater than or equal to about 50% by volume, greater than or equal to about 60% by volume, greater than or equal to about 70% by volume, greater than or equal to about 80% by volume, or even greater than or equal to about 90% by volume of the composite bonding layer 300. In embodiments, the metal matrix 308 may comprise greater than or equal to about 10% by volume, greater than or equal to about 20% by volume, greater than or equal to about 30% by volume, greater than or equal to about 40% by volume, greater than or equal to about 50% by volume, greater than or equal to about 60% by volume, greater than or equal to about 70% by volume, greater than or equal to about 80% by volume, or even greater than or equal to about 90% by volume of the interior bond region 310. In embodiments, the metal matrix 308 may comprise greater than or equal to about 10% by volume, greater than or equal to about 20% by volume, greater than or equal to about 30% by volume, greater than or equal to about 40% by volume, greater than or equal to about 50% by volume, greater than or equal to about 60% by volume, greater than or equal to about 70% by volume, greater than or equal to about 80% by volume, or even greater than or equal to about 90% by volume of the exterior bond region 312.

The soft material members 304 may comprise a material having a lesser elastic modulus than the material of the metal matrix 308. For example, the soft material members 304 may comprise pure metals, polymer, or combinations thereof. In one embodiment, the soft material members 304 may comprise polymers such as, but not limited to, fluoropolymers, phenolic resins, polyanhydrides, polyesters, polyolefins, rubbers, silicones, silicone rubbers, synthetic rubbers, vinyl polymers, or combinations thereof. For example, the stress-reducing additives 304 may comprise polyethylene, polypropylene, polyaryletherketone, fluoro ethylene propylene, PEEK (Poly(ether ether ketone)), polyphenylene sulfon, polyamide, polyamide imide, polyimide, and the combinations and copolymers thereof. The stress-reducing additives 304 may comprise elastomeric polymers, thermoset polymers, thermoplastic polymers, or combinations thereof. In embodiments, the soft material members 304 may comprise greater than or equal to about 50 wt. % of one or more polymers, greater than or equal to about 60 wt. % of one or more polymers, greater than or equal to about 70 wt. % of one or more polymers, greater than or equal to about 80 wt. % of one or more polymers, greater than or equal to about 90 wt. % of one or more polymers, greater than or equal to about 95 wt. % of one or more polymers, greater than or equal to about 99 wt. % of one or more polymers, or even greater than or equal to about 99.5 wt. % of one or more polymers.

In another embodiment, the soft material members 304 may comprise pure metals such as, but not limited to greater than or equal to about 99.5 wt. % copper, greater than or equal to about 99.5 wt. % aluminum, greater than or equal to about 99.5 wt. % silver, greater than or equal to about 99.5 wt. % tin, greater than or equal to about 99.5 wt. % gold, or greater than or equal to about 95 wt. % of another elemental metal.

In embodiments, the material of the soft material members 304 may have an elastic modulus of less than or equal to about 200 GPa, less than or equal to about 150 GPa, less than or equal to about 100 GPa, less than or equal to about 90 GPa, less than or equal to about 80 GPa, less than or equal to about 70 GPa, less than or equal to about 60 GPa, less than or equal to about 50 GPa, less than or equal to about 40 GPa, less than or equal to about 30 GPa, less than or equal to about 20 GPa, less than or equal to about 10 GPa, less than or equal to about 5 GPa, or even less than or equal to about 1 GPa. For example, the material of the metal matrix 308 may have an elastic modulus at least about 1% greater, at least about 2% greater, at least about 3% greater, at least about 4% greater, at least about 5% greater, at least about 10% greater, at least about 25% greater, at least about 50% greater, or even at least about 100% greater than the elastic modulus of the material of the soft material members 304.

The hard material members 306 may comprise a material having a greater elastic modulus than the material of the metal matrix 308. For example, the hard material members 306 comprise ceramics, intermetallic alloys, or combinations thereof. For example, in embodiments, the hard material members 306 may comprise a wide variety of materials, including, but not limited to, one or more alloys such as, but not limited to, materials comprising copper, aluminum, nickel, tin or combinations thereof. In embodiments, the lower substrate 400 may comprise at least about 50 wt. % copper, at least about 60 wt. % copper, at least about 70 wt. % copper, at least about 80 wt. % copper, at least about 90 wt. % copper, at least about 95 wt. % copper, at least about 99 wt. % copper, at least about 99.5 wt. % copper, at least about 50 wt. % aluminum, at least about 60 wt. % aluminum, at least about 70 wt. % aluminum, at least about 80 wt. % aluminum, at least about 90 wt. % aluminum, at least about 95 wt. % aluminum, at least about 99 wt. % aluminum, at least about 99.5 wt. % aluminum, at least about 50 wt. % nickel, at least about 60 wt. % nickel, at least about 70 wt. % nickel, at least about 80 wt. % nickel, at least about 90 wt. % nickel, at least about 95 wt. % nickel, at least about 99 wt. % nickel, and/or at least about 99.5 wt. % nickel.

In other embodiments, the hard material members 306 may comprise metal oxides, metal nitrides, metal carbides, or combinations thereof, including, but not limited to, alumina, beryllium oxide, aluminum nitride, silicon carbide, or combinations thereof. For example, the lower substrate 400 may be a die for a power electronic device. In embodiments, the lower substrate 400 may comprise at least about 50 wt. % metal oxides, at least about 60 wt. % metal oxides, at least about 70 wt. % metal oxides, at least about 80 wt. % metal oxides, at least about 90 wt. % metal oxides, at least about 95 wt. % metal oxides, at least about 99 wt. % metal oxides, at least about 99.5 wt. % metal oxides, at least about 50 wt. % metal nitrides, at least about 60 wt. % metal nitrides, at least about 70 wt. % metal nitrides, at least about 80 wt. % metal nitrides, at least about 90 wt. % metal nitrides, at least about 95 wt. % metal nitrides, at least about 99 wt. % metal nitrides, at least about 99.5 wt. % metal nitrides, at least about 50 wt. % metal carbides, at least about 60 wt. % metal carbides, at least about 70 wt. % metal carbides, at least about 80 wt. % metal carbides, at least about 90 wt. % metal carbides, at least about 95 wt. % metal carbides, at least about 99 wt. % metal carbides, and/or at least about 99.5 wt. % metal carbides.

In embodiments, the material of the hard material members 306 may have an elastic modulus greater than or equal to about 1 GPa, greater than or equal to about 2 GPa, greater than or equal to about 5 GPa, greater than or equal to about 10 GPa, greater than or equal to about 20 GPa, greater than or equal to about 30 GPa, greater than or equal to about 40 GPa, greater than or equal to about 50 GPa, greater than or equal to about 60 GPa, greater than or equal to about 70 GPa, greater than or equal to about 80 GPa, greater than or equal to about 90 GPa, greater than or equal to about 100 GPa, greater than or equal to about 150 GPa, or even greater than or equal to about 200 GPa. For example, the material of the hard material members 306 may have an elastic modulus at least about 1% greater, at least about 2% greater, at least about 3% greater, at least about 4% greater, at least about 5% greater, at least about 10% greater, at least about 25% greater, at least about 50% greater, or even at least about 100% greater than the elastic modulus of the material of the metal matrix 308.

In embodiments, the maximum length of each hard material member 306 or soft material member 304 may be greater than or equal to about 2 microns, greater than or equal to about 3 microns, greater than or equal to about 4 microns, greater than or equal to about 5 microns, greater than or equal to about 7 microns, greater than or equal to about 10 microns, greater than or equal to about 15 microns, greater than or equal to about 20 microns, less than or equal to about 100 microns, less than or equal to about 75 microns, less than or equal to about 50 microns, less than or equal to about 25 microns, less than or equal to about 20 microns, less than or equal to about 15 microns, less than or equal to about 10 microns, less than or equal to about 5 microns. For example, the length 354 of each stress-reducing additive 304 may be from about 3 microns to about 25 microns, or from about 5 microns to about 10 microns, or combinations thereof. As used herein, a "maximum length" means the greatest length measured from one surface to another of a soft material member 304 or hard material member 306, respectively. In embodiments, the soft material members 304 and hard material members 306 may be particle size grains.

Figure 3:
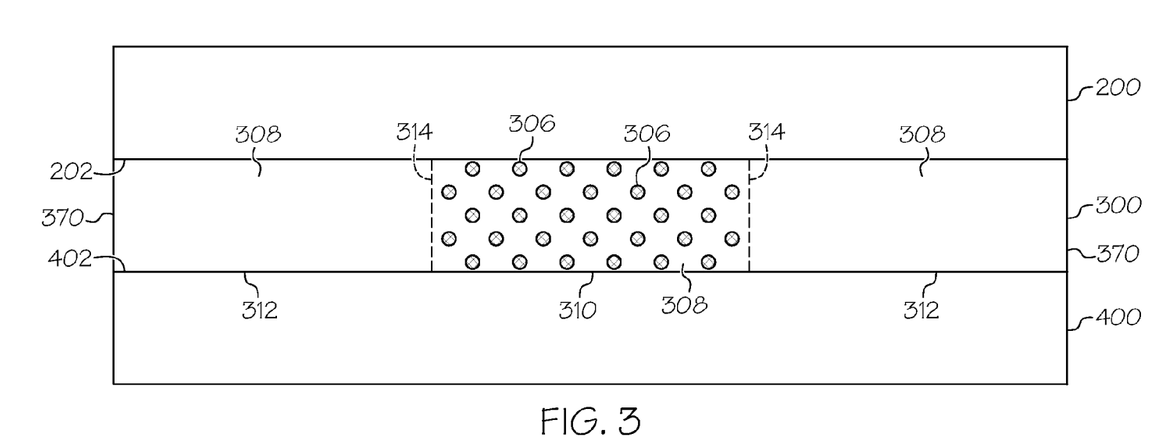
FIG. 3 schematically depicts a cross-sectional side view of two substrates bonded to one another with a composite bonding layer comprising hard material members in the interior bond region, according to one or more embodiments shown and described herein.

Referring now to FIG. 3, in one embodiment, the interior bond region 310 comprises hard material members 306, and the exterior bond region 312 includes only metal matrix 308. In embodiments, the interior bond region 310 may comprise greater than or equal to about 10% by volume, greater than or equal to about 20% by volume, greater than or equal to about 30% by volume, greater than or equal to about 40% by volume, greater than or equal to about 50% by volume, greater than or equal to about 60% by volume, greater than or equal to about 70% by volume, greater than or equal to about 80% by volume, or even greater than or equal to about 90% by volume of the hard material members 306.

Figure 4:
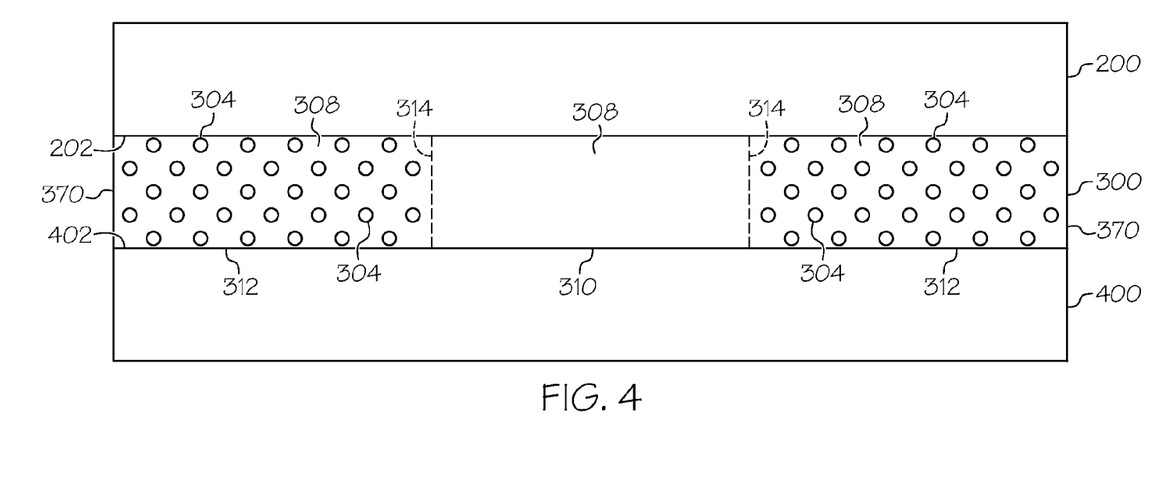
FIG. 4 schematically depicts a cross-sectional side view of two substrates bonded to one another with a composite bonding layer comprising soft material members in the exterior bond region, according to one or more embodiments shown and described herein.

Referring to FIG. 4, in one embodiment, the exterior bond region 312 comprises soft material members 304, and the interior bond region 310 includes only metal matrix 308. In embodiments, the exterior bond region 312 may comprise greater than or equal to about 10% by volume, greater than or equal to about 20% by volume, greater than or equal to about 30% by volume, greater than or equal to about 40% by volume, greater than or equal to about 50% by volume, greater than or equal to about 60% by volume, greater than or equal to about 70% by volume, greater than or equal to about 80% by volume, or even greater than or equal to about 90% by volume of the soft material members 304.

Figure 5:
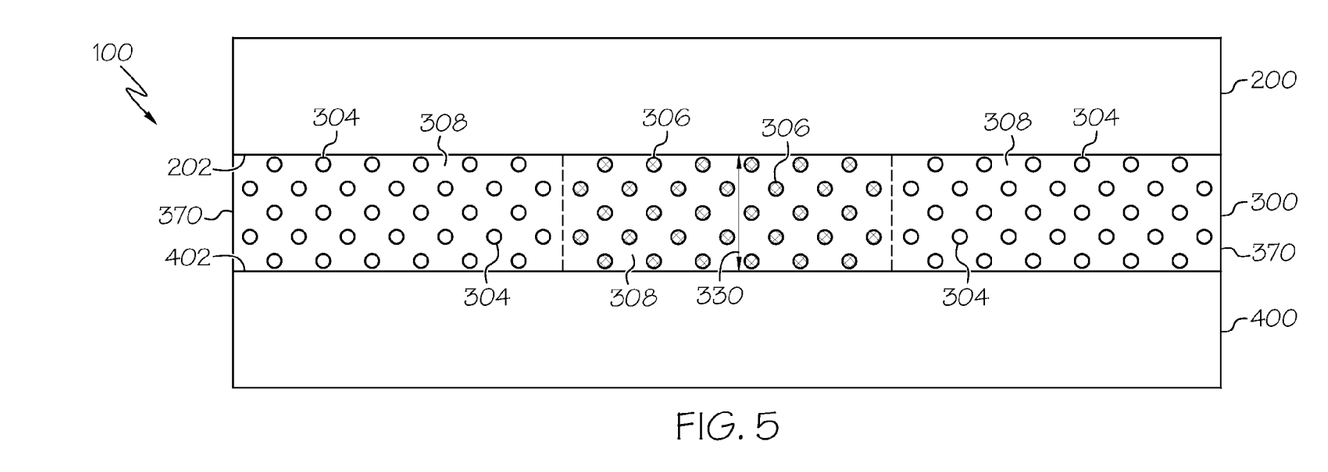
FIG. 5 schematically depicts a cross-sectional side view of two substrates bonded to one another with a composite bonding layer comprising soft material members in the exterior bond region and hard material members in the interior bond region, according to one or more embodiments shown and described herein.

Referring to FIG. 5, in one embodiment, the interior bond region 310 comprises hard material members 306 and the exterior bond region 312 comprises soft material members 304.

Figure 6:
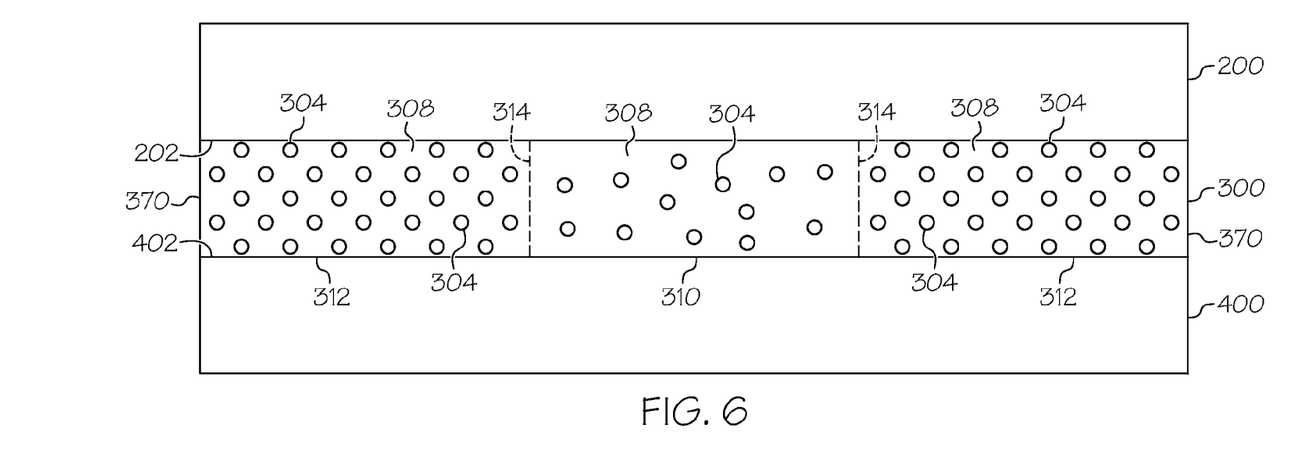
FIG. 6 schematically depicts a cross-sectional side view of two substrates bonded to one another with a composite bonding layer comprising a greater concentration of soft material members in the exterior bond region than the interior bond region, according to one or more embodiments shown and described herein.

Referring to FIG. 6, in one embodiment, there may be a greater concentration of soft material members 304 in the exterior bond region 312 than the interior bond region 310. For example, the exterior bond region 312 may comprise greater than or equal to about 1% by volume, greater than or equal to about 2% by volume, greater than or equal to about 5% by volume, greater than or equal to about 10% by volume, greater than or equal to about 20% by volume, greater than or equal to about 30% by volume, greater than or equal to about 40% by volume, greater than or equal to about 50% by volume, or even greater than or equal to about 100% by volume of soft material members 304 in the exterior bond region 312 than in the interior bond region 310.

Figure 7:
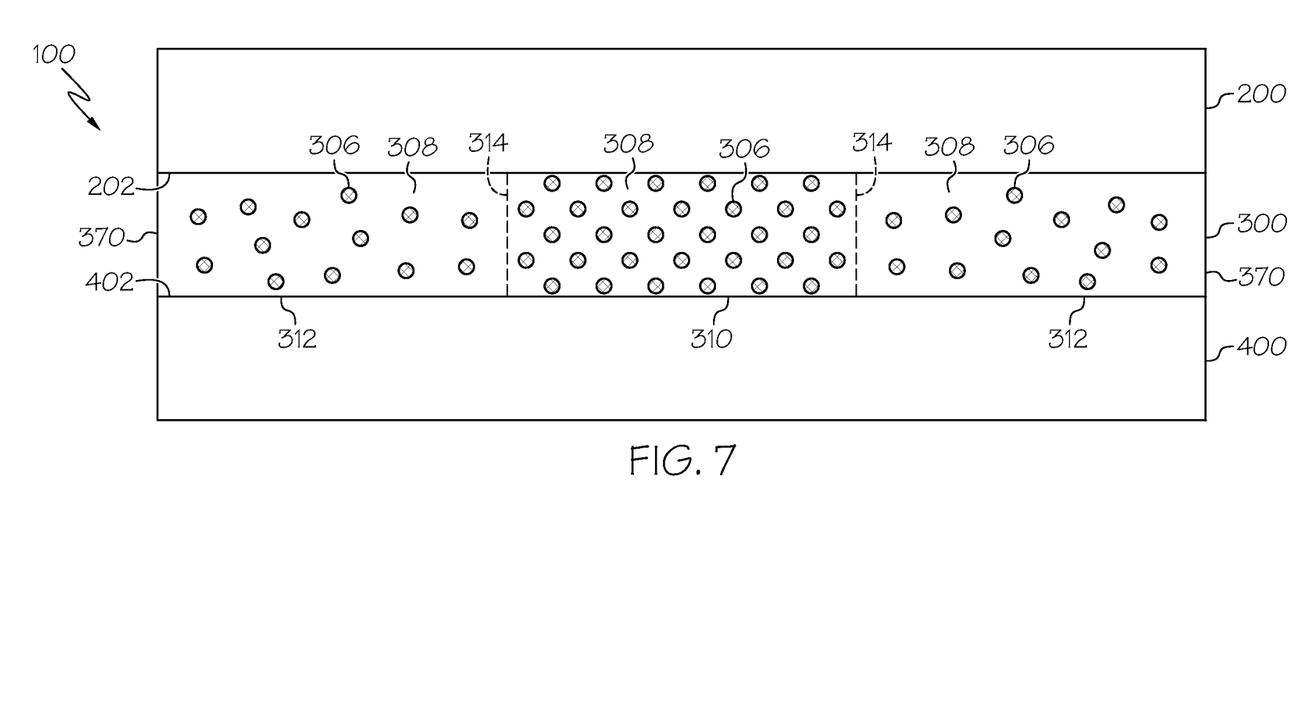
FIG. 7 schematically depicts a cross-sectional side view of two substrates bonded to one another with a composite bonding layer comprising a smaller concentration of hard material members in the exterior bond region than the interior bond region, according to one or more embodiments shown and described herein.

Referring to FIG. 7, in one embodiment, there may be a greater concentration of hard material members 306 in the interior bond region 310 than the exterior bond region 312. For example, the interior bond region 310 may comprise greater than or equal to about 1% by volume, greater than or equal to about 2% by volume, greater than or equal to about 5% by volume, greater than or equal to about 10% by volume, greater than or equal to about 20% by volume, greater than or equal to about 30% by volume, greater than or equal to about 40% by volume, greater than or equal to about 50% by volume, or even greater than or equal to about 100% by volume of hard material members 306 in the interior bond region 310 than in the exterior bond region 312.

It should be appreciated that the schemes employed in FIGS. 3-7 may be combined to from various composite bonding layers. For example, the scheme of FIGS. 6 and 7 may be combined to form a composite bonding layer 300 comprising soft material members 304 in the exterior bond region 312 and the interior bond region 310 as well as hard material members 306 in the interior bond region 310 and exterior bond region 312. In such an embodiment, there may be a greater concentration of soft material members 304 in the exterior bond region 312 than the interior bond region 310, and there may be a greater concentration of hard material members 306 in the interior bond region 310 than the exterior bond region 312.

In embodiments, the exterior bond region 312 may comprise less than or equal to about 10% by volume, less than or equal to about 20% by volume, less than or equal to about 30% by volume, less than or equal to about 40% by volume, less than or equal to about 50% by volume, less than or equal to about 60% by volume, less than or equal to about 70% by volume, less than or equal to about 80% by volume, or even less than or equal to about 90% by volume of the soft material members 304.

In embodiments, the interior bond region 310 may comprise less than or equal to about 10% by volume, less than or equal to about 20% by volume, less than or equal to about 30% by volume, less than or equal to about 40% by volume, less than or equal to about 50% by volume, less than or equal to about 60% by volume, less than or equal to about 70% by volume, less than or equal to about 80% by volume, or even less than or equal to about 90% by volume of the hard material members 306.

The resulting bonded substrates 200, 400 are spaced by a thickness 330 of the composite bonding layer 300, which is the distance between the upper substrate bonding surface 202 and the lower substrate bonding surface 402. In embodiments, the thickness 330 of the composite bonding layer 300 may be from about 5 microns to about 5000 microns, from about 50 microns to about 1000 microns, or from about 100 microns to about 500 microns. For example, the thickness 330 of the composite bonding layer 300 may be at least about 5 microns, at least about 25 microns, at least about 50 microns, at least about 100 microns, at least about 200 microns, at least about 500 microns, less than or equal to about 10000 microns, less than or equal to about 5000 microns, less than or equal to about 1000 microns, less than or equal to about 500 microns, less than or equal to about 250 microns, less than or equal to about 100 microns, or combinations thereof.

According to embodiments, the systems of bonded substrates 100 may be formed by a method comprising providing the first substrate comprising a bonding surface, providing the second substrate comprising a complementary bonding surface, providing a composite bonding layer precursor positioned between the first substrate and the second substrate, where the bonding layer is in contact with the bonding surface of the first substrate and the complementary bonding surface of the second substrate, and forming a composite bonding layer comprising. The composite bonding layer precursor may comprise materials which form the composite bonding layer 300, such as particles of materials that comprise the composite bonding layer 300. In embodiments, the composite bonding layer precursor may comprise the material of the metal matrix 308, soft material members 304, and hard material members 306. The composite bonding layer precursor may be heated to a melting point of a at least one material of the composite bonding layer precursor to form the composite bonding layer 300, such as to a temperature of at least about 150° C., 200° C., 300° C., or even at least about 400° C.

In one embodiment, the composite bonding layer may comprise a transient liquid phase bonded material comprising, for example, tin, nickel, silver, copper, and intermetallic alloys thereof. In such an embodiment, the soft material members 304 and the hard material members 306 may be particles integrated in a precursor mixture which forms the transient liquid phase bonding layer. Generally, transient liquid phase bonding is characterized by a bond between two or more materials that may be stable to heating conditions above those in which the bond is formed. To form a transient liquid phase bond, at least a low melting point material and a high melting point material are utilized to form an intermetallic alloy comprising the materials of the high melting point material and the low melting point material. The high melting point material and the low melting point material may be referred to as precursor materials, and following the transient liquid phase bonding process (e.g., by radiant heating or other means) the precursor materials are at least partially converted to an intermetallic alloy, which may have a melting point greater than that of the temperature at which the bond was formed.

The bonding layers 300 described herein may have enhanced strength properties though thermal cycling, such as reduced crack propagation and reduced creep deformation. Such bonding layers may be useful in high heat devices, such as connecting a heat sink to a power semiconductor device.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

As used herein, the phrase "consisting essentially of" refers to an embodiment that consists of the specified materials and may additionally consist of other materials in amounts that that do not materially affect the basic and novel characteristic(s) of the embodiment. For example, a body that consists essentially of a material may additionally include one or more additional materials in an amount less than about 1 wt. % where the additional material does not materially affect the basic characteristics of the system.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A system of bonded substrates, the system comprising:
   a first substrate comprising a bonding surface;
   a second substrate comprising a complementary bonding surface; and
   a composite bonding layer positioned between the first substrate and the second substrate and in contact with the bonding surface of the first substrate and the complementary bonding surface of the second substrate, the composite boding layer comprising:
   an interior bond region;
   an exterior bond region positioned around the interior bond region and defining an outer surface of the composite bonding layer, the material of the interior bond region having a greater elastic modulus than the material of the exterior bond region;
   a metal matrix, wherein a portion of the metal matrix is in the interior bond region and a portion of the metal matrix is in the exterior bond region; and
   a plurality of soft material members positioned in the portion of the metal matrix in the exterior bond region, or a plurality of hard material members positioned in the portion of the metal matrix in the interior bond region, or both, wherein the soft material members have an elastic modulus less than the elastic modulus of the metal matrix and the hard material members have an elastic modulus greater than the elastic modulus of the metal matrix.

2. The system of claim 1, wherein the plurality of soft material members is positioned in the portion of the metal matrix in the exterior bond region.

3. The system of claim 1, wherein the plurality of hard material members is positioned in the portion of the metal matrix in the interior bond region.

4. The system of claim 1, wherein:
   the plurality of soft material members is positioned in the portion of the metal matrix in the exterior bond region; and
   the plurality of hard material members is positioned in the portion of the metal matrix in the interior bond region.

5. The system of claim 1, wherein the material of the interior bond region has an elastic modulus at least about 10% greater than the material of the exterior bond region.

6. The system of claim 1, wherein the interior bond region may comprises greater than or equal to about 10% by volume of the composite bonding layer.

7. The system of claim 1, wherein the soft material members comprise pure metals, polymers, or combinations thereof.

8. The system of claim 1, wherein the hard material members comprise ceramics, intermetallic alloys, or combinations thereof.

9. The system of claim 1, wherein the interior bond region comprises hard material members and the exterior bond region consists of metal matrix.

10. The system of claim 1, wherein the exterior bond region comprises soft material members and the interior bond region consists of metal matrix.

11. The system of claim 1, wherein the interior bond region and the exterior bond region comprise soft material members, and there is a greater concentration of soft material members in the exterior bond region than the interior bond region.

12. The system of claim 1, wherein the interior bond region and the exterior bond region comprise hard material members, and there are a greater concentration of hard material members in the interior bond region than the exterior bond region.

13. The system of claim 1, wherein the composite bonding layer comprises a transient liquid phase bond.

14. The system of claim 1, wherein the distance between the upper substrate and the lower substrate is from about 5 microns to about 5000 microns.

15. A system of bonded substrates, the system comprising:
a first substrate comprising a bonding surface;
a second substrate comprising a complementary bonding surface; and
a composite bonding layer positioned between the first substrate and the second substrate and in contact with the bonding surface of the first substrate and the complementary bonding surface of the second substrate, the composite boding layer comprising:
an interior bond region;
an exterior bond region positioned around the interior bond region and defining an outer surface of the composite bonding layer, the material of the interior bond region having a greater elastic modulus than the material of the exterior bond region;
a metal matrix, wherein a portion of the metal matrix is in the interior bond region and a portion of the metal matrix is in the exterior bond region; and
a plurality of soft material members positioned in the portion of the metal matrix in the exterior bond region, or a plurality of hard material members positioned in the portion of the metal matrix in the interior bond region, or both, wherein the soft material members have an elastic modulus less than the elastic modulus of the metal matrix and the hard material members have an elastic modulus greater than the elastic modulus of the metal matrix;
wherein:
the soft material members comprise pure metals, polymers, or combinations thereof; and
the hard material members comprise ceramics, intermetallic alloys, or combinations thereof.

16. A method for bonding a first substrate to a second substrate, the method comprising:
providing the first substrate comprising a bonding surface;
providing the second substrate comprising a complementary bonding surface;
providing a composite bonding layer precursor positioned between the first substrate and the second substrate, and the composite bonding layer precursor in contact with the bonding surface of the first substrate and the complementary bonding surface of the second substrate;
forming a composite bonding layer comprising:
an interior bond region;
an exterior bond region positioned around the interior bond region and defining an outer surface of the composite bonding layer, the material of the interior bond region having a greater elastic modulus than the material of the exterior bond region;
a metal matrix, wherein a portion of the metal matrix is in the interior bond region and a portion of the metal matrix is in the exterior bond region; and
a plurality of soft material members positioned in the portion of the metal matrix in the exterior bond region, or a plurality of hard material members positioned in the portion of the metal matrix in the interior bond region, or both, wherein the soft material members have an elastic modulus less than the elastic modulus of the metal matrix and the hard material members have an elastic modulus greater than the elastic modulus of the metal matrix.

17. The method of claim 16, wherein the plurality of soft material members is positioned in the portion of the metal matrix in the exterior bond region.

18. The method of claim 16, wherein the plurality of hard material members is positioned in the portion of the metal matrix in the interior bond region.

19. The method of claim 16, wherein:
the plurality of soft material members is positioned in the portion of the metal matrix in the exterior bond region; and
the plurality of hard material members is positioned in the portion of the metal matrix in the interior bond region.

20. The method of claim 15, wherein the material of the interior bond region has a greater elastic modulus than the material of the exterior bond region.

* * * * *